United States Patent [19]

Crue

[11] 4,238,740
[45] Dec. 9, 1980

[54] PHASE-LOCKED LOOP FOR PCM TRANSMISSION SYSTEMS

[75] Inventor: Charles R. Crue, West Newbury, Mass.

[73] Assignee: Bell Telephone Laboratories, Incorporated, Murray Hill, N.J.

[21] Appl. No.: 8,556

[22] Filed: Feb. 2, 1979

[51] Int. Cl.³ .............................................. H03L 7/08
[52] U.S. Cl. ......................................... 331/17; 331/8; 331/27
[58] Field of Search ...................... 331/17, 18, 25, 27, 331/1 A, 8; 329/50, 122, 124

[56] References Cited

U.S. PATENT DOCUMENTS

| 3,351,868 | 11/1967 | Farrow | 331/17 |
| 3,701,039 | 10/1972 | Lang et al. | 331/17 X |
| 3,983,506 | 9/1976 | Rettinger, Jr. et al. | 331/17 |

OTHER PUBLICATIONS

Cordell et al., "A Highly Stable VCO for Application in Monolithic Phase-Locked Loops", IEEE Journal of Solid State Circuits, vol. SC-10, No. 6, Dec. 1975, pp. 480-485.

D'Altroy, "Switching to Solid State Relays", Bell Laboratories Record, Feb. 1978, pp. 30-37.

*Primary Examiner*—Siegfried H. Grimm
*Attorney, Agent, or Firm*—David R. Padnes

[57] ABSTRACT

A phase-locked loop for PCM transmission systems has a phase comparator (20) which provides continuous regulation of the loop oscillator (30). When a PCM pulse signal is present, the phase comparator selectively compares the PCM and oscillator clock signal and generates an error signal which synchronizes the oscillator to the PCM frequency. During the absence of a PCM pulse, the phase comparator provides a high impedance output and oscillator synchronization is maintained by a loop filter (23). In the disclosed embodiment, the phase comparator is a dual section tristate gate (300).

3 Claims, 3 Drawing Figures

PHASE-LOCKED LOOP FOR PCM TRANSMISSION SYSTEMS

TECHNICAL FIELD

This invention relates to a phase-locked loop for PCM transmission systems and, more particularly, to a phase-locked loop which uses phase comparator means to regulate continuously an oscillator frequency.

BACKGROUND OF THE INVENTION

Phase-locked loops have traditionally been used to adjust automatically the frequency of oscillators. In digital transmission systems, for example, a phase-locked loop is used to produce a clock signal from an oscillator in the receiver that is synchronous with the frequency of the incoming signal. This clock signal controls the regeneration of the incoming signal by other repeater circuitry.

A perennial problem exists with the use of phase-locked loops in PCM transmission systems. Use of traditional phase comparators in such systems results in a loss of oscillator control due to erroneous phase comparisons made during intervals when the incoming data bits are logical zeros. The oscillator frequency, controlled by the phase comparator, then drifts, resulting in errors in the regenerated data until the oscillator is resynchronized to the incoming data frequency.

An approach to the problem of oscillator drift and the resulting loss of data is to decrease the time required to resynchonize the oscillator. In U.S. Pat. No. 3,351,868 to C. W. Farrow, issued Nov. 7, 1967, an exclusive-OR phase comparator and countdown circuit are utilized to minimize the resynchronization or lock-in time. Similarly, in U.S. Pat. to Rettinger, Jr., No. 3,983,506, issued Sept. 28, 1976, a tristate signal conditioner is employed to reduce lock-in time. The signal conditioner turns off the oscillator a predetermined time after the absence of data is detected. When transmitted data is again detected the oscillator is reset to the nominal data frequency.

This approach, as exemplified in the prior art, is not satisfactory for PCM system applications. In such systems, the data can contain a long series of zeros. Proper regeneration of such data requires a continuous running oscillator synchronized to the data frequency.

SUMMARY OF THE INVENTION

Pursuant to the present invention, the above prior art shortcomings are avoided through the use of a phase-locked loop having phase comparison means which allows the oscillator-produced clock to remain at its previous phase-locked frequency during the time that phase comparisons are not possible (i.e., when the incoming data is logic "0"). As in conventional phase-locked loop designs, the output of the comparator is connected to the receiver oscillator via a loop filter, which controls the operating parameters of the loop. The voltage across the loop filter capacitor increases or decreases the nominally supplied oscillator voltage to respectively increase or decrease the oscillator frequency.

During the transmission of PCM logical zeros, the phase comparator provides a high impedance output. This, in effect, disconnects the comparator from the receiver oscillator. During this time, the d.c. voltage necessary to maintain the preexisting synchronized oscillator frequency is held by a capacitor in the loop filter. The time constant for the loop filter and oscillator input circuitry is significantly greater than the time duration of the longest series of PCM zeros.

When a PCM pulse is present, the phase comparator functions logically as an exclusive-OR gate. A low or logic "0" output is only produced when an oscillator pulse is present along with the PCM pulse. The presence of the PCM pulse and absence of the oscillator pulse produces a high or logic "1" output.

In addition to these functions, the phase comparator also produces a continuous reference voltage to set the oscillator free running frequency at the expected frequency of the incoming PCM pulses.

It is an advantageous feature of the present invention that the aforementioned phase comparator is a tristate gate.

It is also a feature of the present invention that the signals within the phase-locked loop are balanced for good common mode rejection of noise and to double the voltage swing of the tristate gate output to increase the loop gain. The circuit could, of course, be implemented electrically unbalanced.

DETAILED DESCRIPTION

Figure 1:
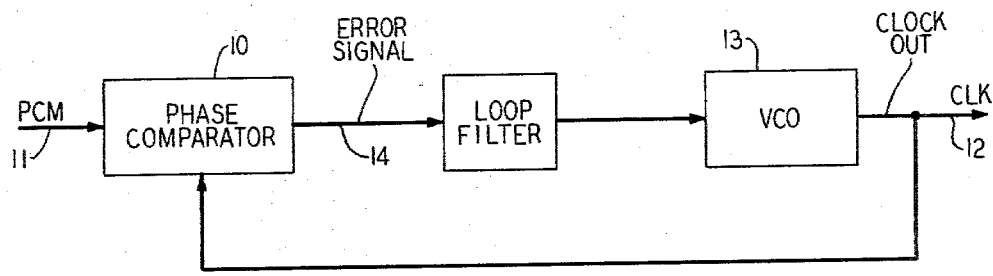
FIG. 1 is a block diagram representation of the traditional phase-locked loop.

FIG. 1 illustrates a block representation of a conventional phase-locked loop for an incoming PCM signal. As shown, phase comparator 10 compares the phase relationship between the incoming PCM signal 11 and the clock output 12 generated by voltage controlled oscillator (VCO) 13. The output 14 of the phase comparator is an error signal which is supplied to the input of VCO 13, via the loop filter, to synchronize the frequency of clock 12 to that of the incoming PCM signal 11. As discussed, supra, the problem with the above scheme for PCM data is the inability to control the oscillator frequency during the time instants when the PCM data bits are zero. The oscillator then drifts and the frequency of clock 12 is no longer synchronized with the frequency of PCM signal 11.

Figure 2:
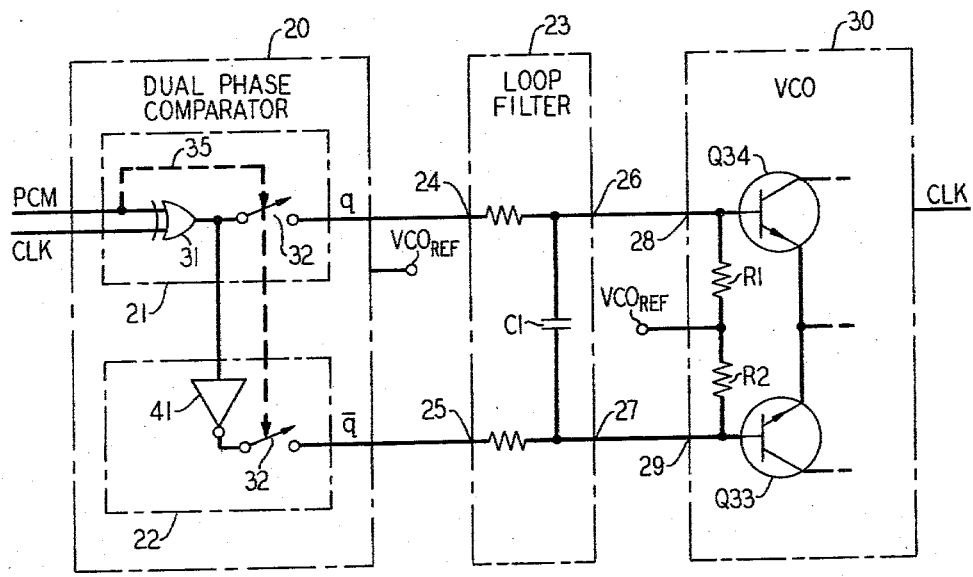
FIG. 2 is a block diagram and partial schematic of the phase-locked loop configuration according to the present invention.

FIG. 2 shows a block diagram of a phase-locked loop arranged according to the present invention. As depicted, PCM and CLK are supplied to section 21 of the dual phase comparator 20. The output or error signal q from section 21 is fed into one side 24 of loop filter 23. Loop filter 23 is of conventional balanced lag-lead type design. Section 22 of dual phase comparator 20 produces a complementary output or error signal $\bar{q}$ which is connected to the second side 25 of loop filter 23. The outputs of loop filter 26 and 27 are respectively connected to balanced input terminals of 28 and 29 of the voltage controlled oscillator (VCO) 30. VCO 30 is a highly stable RC type astable multivibrator that produces clock signal CLK. One such multivibrator found to be particularly well suited is the design disclosed by R. R. Cordell and W. G. Garrett in their article entitled "A Highly Stable VCO for Application in Monolithic Phase-Locked Loops", *IEEE Journal of Solid State Circuits*, Vol. SC-10, No. 6, published December 1975.

For illustrative purposes, the primary function of the dual phase comparator 20 is logically presented in 21 by an exclusive-OR gate in series with a switch 32. Inverter 41 of section 22 logically inverts the output of 31. Each switch 32 is controlled such that an exclusive-OR output is provided, only when a PCM pulse is present. This control feature is represented by dotted line 35. When a PCM pulse is present, the outputs q and $\bar{q}$ will respectively be in a logic "0" or logic "1" state for the time instants when PCM and CLK are 1. Alternatively, when PCM and CLK are respectively a "1" and "0", a logic "1" or high output will be produced at q and a "0" or low output will be produced at $\bar{q}$. During the times a PCM pulse is not present, switches 32 will be open, thereby disconnecting the exclusive-OR output.

Loop filter 23 integrates outputs q and $\bar{q}$. The charge on loop filter capacitor C1 will vary directly with the duty cycle of signals q and $\bar{q}$. When the duration of the high output state of q is greater than the duration of the low output state of q the charge on capacitor C1 increases. Conversely, when the duration of the low output state of q is longer than the duration of the high output state of q, the charge on capacitor C1 decreases.

The d.c. voltage across capacitor C1 controls the VCO frequency. As shown, the voltage is fed to the bases of emitter coupled transistors Q33 and Q34 at the VCO input. Both transistors are also supplied with a continuous reference voltage, VCO$_{ref}$, generated within dual phase comparator 20, to set the VCO at the nominal free running oscillator frequency. This free running oscillator frequency is set to the expected PCM frequency. In T1 Transmission Systems the PCM frequency is nominally 1.544 MHz and in T1C systems the frequency is 3.152 MHz.

As with conventional voltage controlled multivibrators, the output frequency, in this case the frequency of CLK varies directly with the input voltage. As shown in FIG. 2 this input voltage is the algebraic sum of the d.c. voltage across loop filter capacitor C1 and the voltage derived from source VCO$_{ref}$ through VCO bias resistors R1 and R2.

As discussed supra, when the PCM input to either section 21 is logic "0", then the switch 32 will be open. At such times, the frequency of CLK will be maintained at the previously synchronized frequency, i.e., when the last phase comparison was made, by the voltage on loop filter capacitor C1. The time constant for the discharge of C1 toward VCO$_{ref}$ is dominated by input bias resistors R1 and R2 for high beta transistors Q33 and Q34. The values of R1 and R2 can be advantageously chosen so that the time constant for capacitor C1 is much greater than the longest valid interval of PCM zeros, thereby avoiding loss of oscillator frequency or phase integrity.

Figure 3:
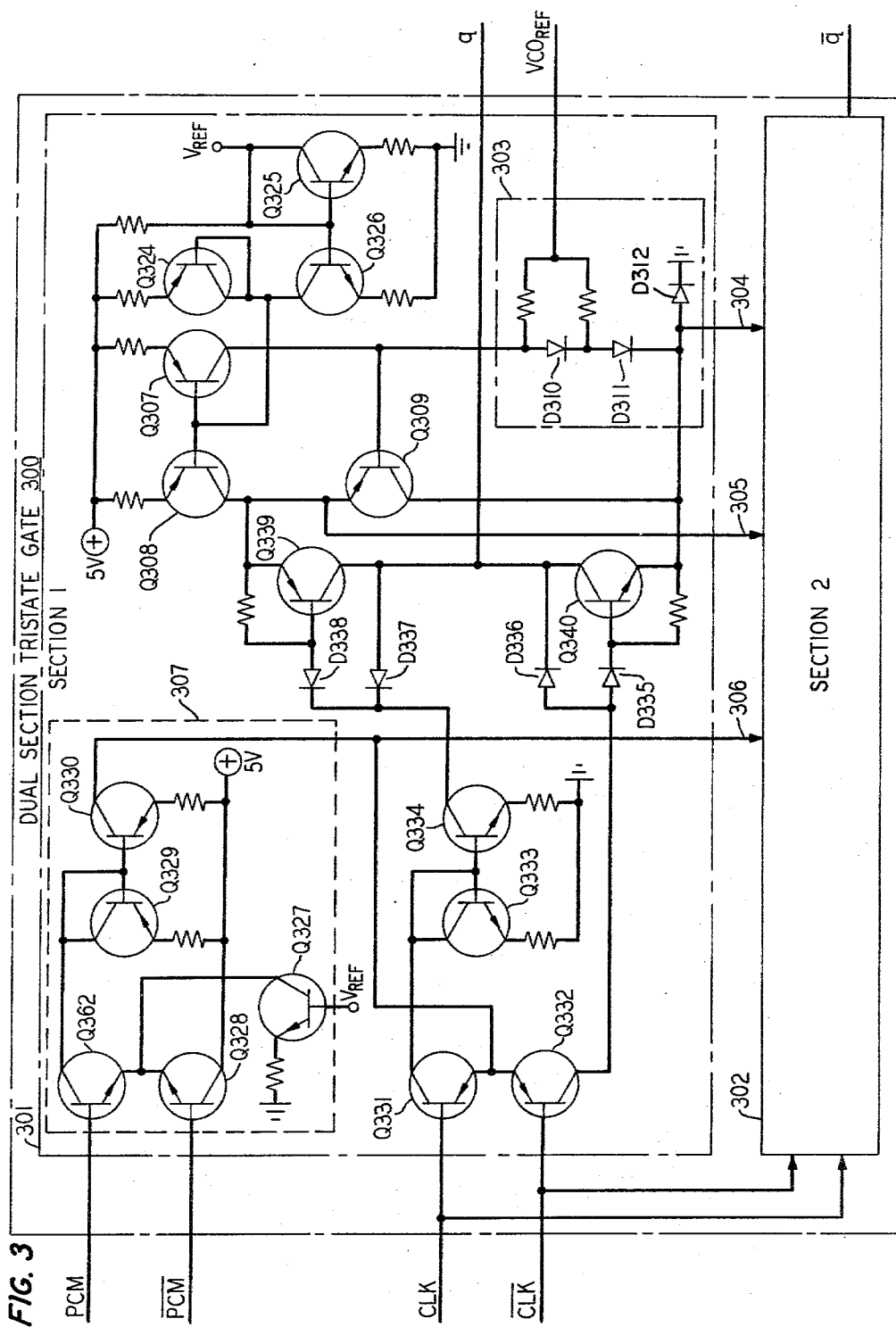
FIG. 3 is a detailed schematic of the dual phase comparison means shown in FIG. 2.

In the disclosed embodiment of the present invention, dual phase comparator 20 is realized through the use of a dual section tristate semiconductor device 300. The inputs to tristate device 300 are pairs of complementary signals; PCM and $\overline{PCM}$ and CLK and $\overline{CLK}$. The detailed schematic of one section 301 of the tristate gate 300 is illustrated in FIG. 3. The second section for the generation of complementary output signal $\bar{q}$ is represented by block 302 within FIG. 3. Block 302 is identical to block 301 except for voltage divider subsection 303 and the PCM gate 307 which for circuit economy reasons are not duplicated in block 302. Lead 304 connects the emitter of Q340 to its complement in block 302 and lead 305 connects the emitter of Q339 to its complement in block 302. Lead 306 connects the output of the PCM gate 307 to the complement of emitter coupled transistor pair Q331 and Q332 located in block 302. A discussion of the detailed circuitry will now be presented in light of the preceeding discussion.

In the absence of a PCM pulse, transistor Q362 is off and the current is steered through Q328. With transistor Q362 off, transistors Q329 and Q330 are also off. As there is no current flowing into the emitter coupled pair Q331, Q332 these transistors are off, regardless of the state of CLK and $\overline{CLK}$. Transistor Q334 controls the bias current for output transistor Q339. Bias current flows from the 5 volt supply through Q308, D338 and through Q334 to ground. As Q332 is off, Q334 does not conduct and output transistor Q339 is off. Similarly, Q332 supplies bias current to output transistor Q340. Therefore, Q340 is also off and a high impedance state appears at terminal q.

In the presence of a PCM pulse, balanced VCO input CLK or $\overline{CLK}$ turns on transistor Q331 or Q332. When CLK is low and $\overline{CLK}$ is high, Q331 is turned on. Collector current of Q331 is mirrored through diode connected transistor Q333 to transistor Q334 to provide bias current to turn on output transistor Q339. The voltage swing at the collector of Q339 is controlled by diodes D338 and D337. Base current of Q339 flows through diode D338 and transistor Q334. Current through diode D337 clamps the voltage at the collector of Q339 at a voltage one diode drop less than the emitter voltage of Q339. This is the previously discussed logic "1" voltage output at q.

Conversely, when CLK is high and $\overline{CLK}$ is low transistor Q332 is turned on and transistor Q331 is off. Since Q331 is off, Q339 is off because base current cannot flow through transistor Q334. Collector current of Q332 does, however, flow through diode D335 and the base of transistor Q340 to turn Q340 on. Diode D336 clamps the collector voltage of Q340 at one diode drop above the emitter voltage. This is the aforementioned logic "0" or low voltage output.

Transistors Q325, Q326, Q324, Q307 and Q308 set the quiescent current conditions for the voltage divider string of diodes D312, D311, D310 and transistor D309 as well as providing a reference voltage V$_{ref}$. V$_{ref}$ is supplied to transistor Q327, to set the current supplied by the latter to emitter coupled pair Q362 and Q328. The resistive divider across diode D310 derives a reference voltage, designated as VCO$_{ref}$, equal to one-half the output voltage swing at q. VCO$_{ref}$ provides the voltage necessary to set the VCO at its nominal free running frequency at the start of the PCM data transmission.

I claim:

1. A phase-locked loop circuit for extracting a clock signal from a PCM signal comprising a voltage controlled oscillator (30) connected in a phase-locked loop for generating a clock signal having a frequency determined by a control signal (14) produced within the phase-locked loop, characterized in that said loop circuit further includes phase comparison means (20) for selectively comparing the phase between a PCM signal and the oscillator clock signal only at times when a PCM pulse is present and generating therefrom a control signal to synchronize the oscillator clock at the PCM frequency, said means providing a high impedance output at times when a PCM pulse is absent, said means comprising a dual section tri-state gate (300)

including voltage means (303) for providing the voltage required to cause said voltage controlled oscillator to oscillate at a predetermined frequency, and filter means (23) connected between the output of said phase comparison means and the input (28, 29) of said voltage controlled oscillator for coupling said control signal to said oscillator, the output (26, 27) of said filter means further serving to hold the oscillator frequency fixed during the high impedance state of said phase comparison means.

2. The phase-locked loop circuit of claim 1 wherein said filter means (23) comprises a balanced lag-lead RC type filter.

3. The phase-locked loop circuit of claim 2 wherein said voltage controlled oscillator (30) comprises a stable RC type multivibrator.

* * * * *